(12) United States Patent
Bedell et al.

(10) Patent No.: US 8,916,450 B2
(45) Date of Patent: Dec. 23, 2014

(54) METHOD FOR IMPROVING QUALITY OF SPALLED MATERIAL LAYERS

(75) Inventors: Stephen W. Bedell, Wappingers Falls, NY (US); Keith E. Fogel, Hopewell Junction, NY (US); Paul A. Lauro, Brewster, NY (US); Ning Li, White Plains, NY (US); Devendra K. Sadana, Pleasantville, NY (US); Katherine L. Saenger, Ossining, NY (US); Ibrahim Alhomoudi, Alhufof (SA)

(73) Assignees: International Business Machines Corporation, Armonk, NY (US); King Abdulaziz City for Science and Technology, Riyadh (SA)

( * ) Notice: Subject to any disclaimer, the term of this patent is extended or adjusted under 35 U.S.C. 154(b) by 320 days.

(21) Appl. No.: 13/565,378

(22) Filed: Aug. 2, 2012

(65) Prior Publication Data

US 2014/0034699 A1  Feb. 6, 2014

(51) Int. Cl.
 *H01L 21/30* (2006.01)
 *H01L 21/46* (2006.01)
 *H01L 21/00* (2006.01)

(52) U.S. Cl.
 USPC .................................. 438/458; 257/E21.088

(58) Field of Classification Search
 None
 See application file for complete search history.

(56) References Cited

U.S. PATENT DOCUMENTS

| | | | |
|---|---|---|---|
| 6,638,835 B2 * | 10/2003 | Roberds et al. | 438/458 |
| 6,946,361 B2 | 9/2005 | Takayama et al. | |
| 8,247,261 B2 * | 8/2012 | Bedell et al. | 438/73 |
| 8,293,619 B2 * | 10/2012 | Henley | 438/458 |
| 8,450,184 B2 * | 5/2013 | Bedell et al. | 438/455 |
| 2001/0009283 A1 * | 7/2001 | Arao et al. | 257/303 |
| 2001/0055854 A1 * | 12/2001 | Nishida et al. | 438/455 |
| 2009/0038678 A1 * | 2/2009 | Pan et al. | 136/255 |
| 2010/0307572 A1 * | 12/2010 | Bedell et al. | 136/255 |
| 2010/0307591 A1 * | 12/2010 | Bedell et al. | 136/262 |
| 2010/0310775 A1 * | 12/2010 | Bedell et al. | 427/383.3 |
| 2010/0311250 A1 | 12/2010 | Bedell et al. | |
| 2011/0048517 A1 * | 3/2011 | Bedell et al. | 136/255 |
| 2012/0217622 A1 * | 8/2012 | Bedell et al. | 257/632 |

FOREIGN PATENT DOCUMENTS

WO 2004/077553 A1 9/2004

OTHER PUBLICATIONS

Zhao, Z. B., et al., "Evolution of anisotropic microstructure and residual stress in sputtered Cr films", Journal of Applied Physics, Dec. 15, 2002, vol. 92, No. 12.

Vink, T. J., et al., "Stress, strain, and microstructure of sputter-deposited Mo thin films", J Appl. Phys., Oct. 15, 1991, 70 (8).

International Search Report and Written Opinion dated Nov. 11, 2013 from related International Application No. PCT/IB2013/056348.

* cited by examiner

*Primary Examiner* — Scott B Geyer
*Assistant Examiner* — Evren Seven
(74) *Attorney, Agent, or Firm* — Scully, Scott, Murphy & Presser, P.C.; Louis J. Percello, Esq.

(57) ABSTRACT

Methods for removing a material layer from a base substrate utilizing spalling in which mode III stress, i.e., the stress that is perpendicular to the fracture front created in the base substrate, during spalling is reduced. The substantial reduction of the mode III stress during spalling results in a spalling process in which the spalled material has less surface roughness at one of its' edges as compared to prior art spalling processes in which the mode III stress is present and competes with spalling.

9 Claims, 5 Drawing Sheets

US 8,916,450 B2

METHOD FOR IMPROVING QUALITY OF SPALLED MATERIAL LAYERS

BACKGROUND

The present disclosure relates to semiconductor device manufacturing, and more particularly, to methods for removing a high-quality material layer from a base substrate by spalling.

Devices that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if the substrate from which a device layer is removed can be reused, additional fabrication cost reduction can be achieved.

Recent advances in spalling techniques now make it possible to remove, i.e., spall, a thin (typically less than 100 μm) material layer from an entire surface of base substrate with near-zero thickness direction kerf losses, and to do this multiple times on the same base substrate. The potential cost savings are enormous since (i) the thickness of the spalled material layer can be limited to the thickness needed for thin-film devices, and (ii) many spalled material layers may be derived from a single base substrate.

Further improvements in spalling are however needed which render spalling more efficient, controllable, and economical and thus more reliable for use in fabricating thin film semiconductor devices.

SUMMARY

The present disclosure provides methods for removing a material layer from a base substrate utilizing spalling in which mode III stress, i.e., a stress component that is perpendicular to the fracture front created in the base substrate during spalling, is substantially reduced. By "substantially reduced" it is meant that the methods of the present disclosure lower the mode III stress within the base substrate during spalling to a value that is 50% or less as compared to an equivalent prior art method in which mode III stress is present during the spalling process. The substantial reduction of the mode III stress during spalling results in a spalling process in which the spalled material has less surface roughness at the edges of the spalled material as compared to prior art spalling processes in which the mode III stress is present and competes with spalling. A surface roughness reduction of up to a factor of 100 or greater can be achieved near the edge regions of a layer using the methods of the present disclosure.

Applicants have determined through experimentation that mode III stress can be substantially reduced when spalling is performed under conditions in which uniaxial stress is the major stress component present during the spalling process. When biaxial stress is the major stress component present during the spalling process, mode III stress competes with spalling and the resultant spalled material has an unwanted surface roughness near one of its edges.

In one aspect, a method of removing a material layer from a base substrate in which mode III stress is substantially reduced is provided that includes providing a stressor layer with uniaxial stress (i.e., either intrinsic uniaxial stress or an acquired uniaxial stress using a stressor layer having an intrinsic biaxial stress which has been modified to be uniaxial) atop a base substrate, wherein the base substrate has a fracture toughness that is less than that of the stressor layer. Next, a material layer is removed from the base substrate by spalling.

In another aspect, a method of removing a material layer from a base substrate in which mode III stress is substantially reduced is provided that includes providing a structure that includes a stressor layer having intrinsic biaxial stress atop a base substrate, wherein the base substrate has a fracture toughness that is less than that of the stressor layer. A curvature is then provided to the structure. Next, a material layer is removed from the base substrate by spalling, while maintaining the curvature in the structure.

DETAILED DESCRIPTION

Figure 1:
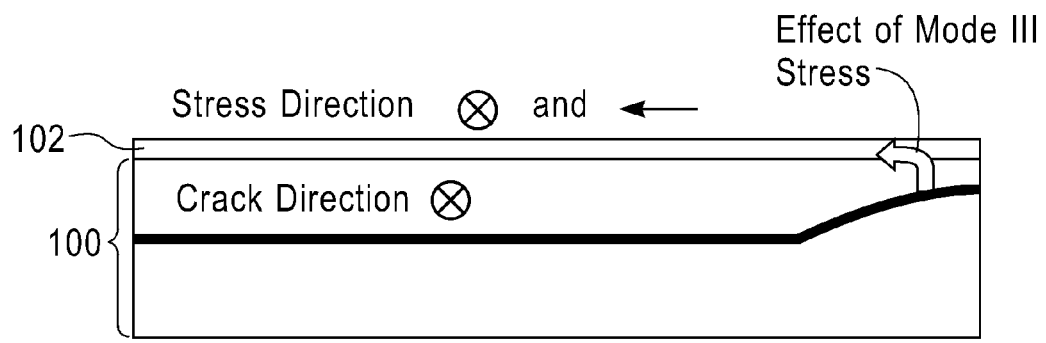
FIG. 1 is a pictorial representation (through a cross sectional view) illustrating a prior art structure during a conventional spalling process in which mode III stress competes with spalling.

The present disclosure, which provides methods of removing a high-quality material layer from a base substrate by spalling, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

As mentioned above, spalling is one technique that is now available to remove a thin (typically less than 100 μm) material layer from an entire surface of base substrate. One such prior art spalling process is disclosed, for example, in U.S. Patent Application Publication No. 2010/0311250 to Bedell et al. Specifically, the spalling process disclosed in the '250 Application includes depositing a stressor layer (i.e., a spall-inducing layer) on a base semiconductor substrate, placing an optional handle substrate on the stressor layer, and inducing a crack and its propagation below the substrate/stressor interface. At some stages after spalling, some, or all, of the stressor layer can be removed utilizing an etch process. In the '250 Application, spalling occurs in the presence of biaxial stress.

Recently, it was been observed that during the application of a controlled spalling process using stress inducing layers such as described, for example, in the '250 Application, the surface roughness of the spalled material located at one edge thereof was higher as compared with other surface portions of the spalled material. Hence, optimal spalling of the material layer from the base substrate is not achieved utilizing prior art spalling processes in which mode III stress is present and competes with spalling.

One possible explanation of this phenomenon could be that stress acting orthogonal to the fracture propagation direction (arising from the transition from stressed to non-stressed regions at the wafer edge) creates in combination with the pre-existing mode I and mode II stresses, and additional mode III stress. The effect of the presence of non-zero mode III stress at the advancing fracture front could tend to rotate the crack path about an axis parallel with the cleave direction. This competing fracture trajectory may be an origin of the increased surface roughness that is observed when typical controlled spalling processes are employed.

A fracture front is defined as the boundary between fractured and non-fractured material (i.e., the crack) and has a direction defined by the instantaneous direction of fracture. A material undergoing fracture can be subjected to three principle stresses; mode I (or opening mode), mode II (shear mode) and mode III. In mode I, stress is applied in a direction normal to the plane of fracture. In mode II, stress is applied in shear parallel to the direction of fracture. In mode III, stress is applied in shear perpendicular to the direction of fracture. Spalling mode fracture is a phenomenon that occurs when both mode I and mode II are present simultaneously. The mode II stress deflects the advancing crack tip either downward into the substrate (for a tensile stressor layer) or upwards towards the surface (for a compressive stressor).

The effect of mode III stress is to rotate the crack front about an axis parallel with the fracture direction. When the stressor is under biaxial tensile stress, mode III stress is present at the edges of the substrate that have boundary normal vectors orthogonal to the fracture direction (position C in FIG. 2) and therefore has higher surface roughness. When the boundary normal vector is parallel to the fracture direction (position B in FIG. 2) only mode I and mode II stresses are present and the surface is smoother. Using a biaxial stressor, mode III stress is also present along the fracture front when curvature is present and is shown schematically in position C in FIG. 2.

Figure 2:
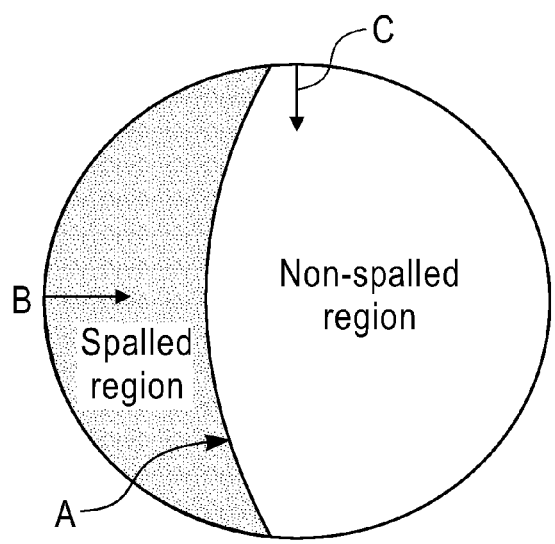
FIG. 2 is a pictorial representation (through a top-down) illustrating a prior art structure during a conventional spalling process in which mode III stress competes with spalling.

Referring to FIG. 1, there is shown a cross-sectional view of a prior art structure including a base substrate 100 and a stressor layer 102. In this example, spalling is performed in the presence of mode III stress due to the biaxial stress that is present in the original stressor layer 102. Since mode III stress is present during spalling the stress direction is perpendicular, i.e., orthogonal, to the crack direction. As such, the crack that is formed will rotate out of the plane and will compete with spalling at the edge of the base substrate. This results in unwanted surface roughness at the edges of the spalled materials. In FIG. 1, the stress is biaxial and therefore into (and out of) the page as indicated by the arrow-tail symbol as well as directed in from the edge (for tensile stress). Also in FIG. 1 the crack propagation direction is into the page as indicated by the arrow-tail symbol. FIG. 2 illustrates a top view of a same type prior art structure during spalling showing the spalled region, and the non-spalled region. The arrow designated as A is the fracture front and has a direction defined by the fracture propagation direction, the arrow designed as B is the location of fracture initiation and has a boundary normal vector parallel to the fracture propagation direction and the arrow designed as C is the boundary that is perpendicular to the fracture propagation. It is noted that the mode III stress described above is identified by arrow C as well.

Because the existence of a stress discontinuity at the stress edge is a certainty, a method of reducing transverse stress, i.e., mode III stress, along the film edges orthogonal to the fracture direction is required. Additionally, instability in a propagating fracture front, such as curvature, will tend to create additional roughness by the same mechanism.

In view of the above, and as stated previously, the present disclosures provides various methods of spalling a material layer from a base substrate wherein the spalling process is performed under conditions in which mode III stress, i.e., the stress that is perpendicular to the fracture front created in the base substrate during spalling, is reduced. The substantial reduction of the mode III stress during spalling results in a spalling process in which the spalled material has less surface roughness at its' edges as compared to prior art spalling processes in which the mode III stress is present and competes with spalling. As such, the present disclosure provides a high quality, in terms of a reduced surface roughness, spalled material layer.

Applicants have determined through experimentation that mode III stress can be substantially reduced when spalling is performed under conditions in which uniaxial stress is the major stress component present during the spalling process. When biaxial stress is the major stress component present during the spalling process, mode III stress competes with spalling and the resultant spalled material has an unwanted surface roughness near one of its' edges. It is also contemplated herein that the direction of uniaxial stress corresponds to preferred fracture propagation directions as described in U.S. Patent Application Publication No. 2010/0311250 to Bedell et al. For example, the primary direction of the uniaxial stress can be made to be aligned to any of the 4 [100] directions when a <001> crystal serves as the base substrate 10.

Figure 3:
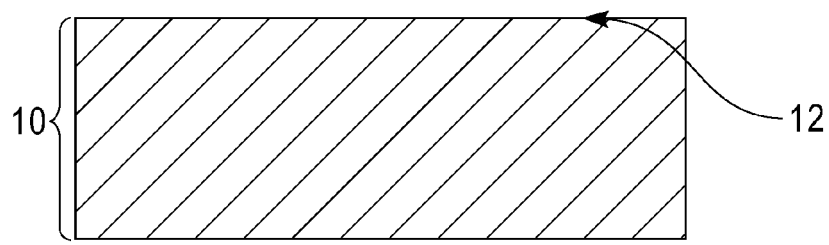
FIG. 3 is a pictorial representation (through a cross-sectional view) depicting a base substrate that can be employed in one embodiment of the present disclosure.

Referring first to FIG. 3, there is shown a base substrate 10 having an uppermost surface 12 that can be employed in one embodiment of the present disclosure. The base substrate 10 that can be employed in the present disclosure may comprise a semiconductor material, a glass, a ceramic, or any another material whose fracture toughness is less than that of the stressor layer to be subsequently formed.

Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

When the base substrate 10 comprises a semiconductor material, the semiconductor material may include, but is not limited to, Si, Ge, SiGe, SiGeC, SiC, Ge alloys, GaSb, GaP, GaN, GaAs, InAs, InP, and all other III-V or II-VI compound semiconductors. In some embodiments, the base substrate 10 is a bulk semiconductor material. In other embodiments, the base substrate 10 may comprise a layered semiconductor material such as, for example, a semiconductor-on-insulator or a semiconductor on a polymeric substrate. Illustrated examples of semiconductor-on-insulator substrates that can be employed as base substrate 10 include silicon-on-insulators and silicon-germanium-on-insulators.

When the base substrate 10 comprises a semiconductor material, the semiconductor material can be doped, undoped or contain doped regions and undoped regions.

In one embodiment, the semiconductor material that can be employed as the base substrate 10 can be single crystalline (i.e., a material in which the crystal lattice of the entire sample is continuous and unbroken to the edges of the sample, with no grain boundaries). In another embodiment, the semiconductor material that can be employed as the base substrate 10 can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the base substrate 10 can be amorphous (i.e., a non-crystalline material that lacks the long-range order characteristic of a crystal). Typically, the semiconductor material that can be employed as the base substrate 10 is a single crystalline material.

When the base substrate 10 comprises a glass, the glass can be a $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic can be any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, one or more devices including, but not limited to, transistors, capacitors, diodes, BiCMOS, resistors, etc. can be processed on and/or within the uppermost surface 12 of the base substrate 10 utilizing techniques well known to those skilled in the art.

In some embodiments of the present disclosure, the uppermost surface 12 of the base substrate 10 can be cleaned prior to further processing to remove surface oxides and/or other contaminants therefrom. In one embodiment of the present disclosure, the base substrate 10 is cleaned by applying to the base substrate 10 a solvent such as, for example, acetone and isopropanol, which is capable of removing contaminates and/or surface oxides from the uppermost surface 12 of the base substrate 10.

Figure 4:
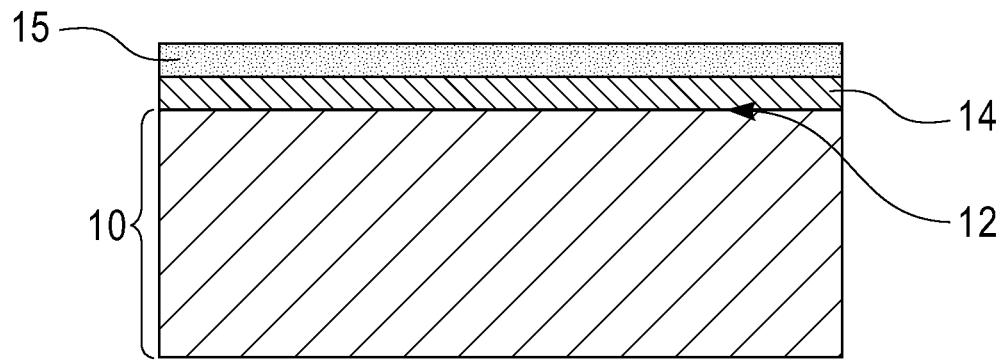
FIG. 4 is a pictorial representation (through a cross sectional view) depicting the structure of FIG. 3 after forming an optional metal-containing layer and an optional plating seed layer atop the base substrate.

Referring to FIG. 4, there is depicted the base substrate 10 of FIG. 3 after forming an optional metal-containing adhesion layer 14 and an optional plating seed layer 15 atop the base substrate 10. In some embodiments, at least one of the optional metal-containing adhesion layer 14 and the optional plating seed layer 15 is employed. In other embodiments, both the optional metal-containing adhesion layer 14 and the optional plating seed layer 15 are employed. In another embodiment, neither the optional metal-containing adhesion layer 14, nor the optional plating seed layer 15 is employed.

The optional metal-containing adhesion layer 14 is employed in embodiments in which the stressor layer to be subsequently formed has poor adhesion to uppermost surface 12 of base substrate 10. Typically, the metal-containing adhesion layer 14 is employed when a metal-containing stressor layer is employed.

The optional metal-containing adhesion layer 14 which can be employed in the present disclosure includes any metal adhesion material such as, but not limited to, Ti/W, Ti, Cr, Ni or any combination thereof. The optional metal-containing adhesion layer 14 may comprise a single layer or it may include a multilayered structure comprising at least two layers of different metal adhesion materials.

The metal-containing adhesion layer 14 that can be optionally formed on the uppermost surface 12 of base substrate 10 can be formed at room temperature (15° C.-40° C.) or above. In one embodiment, the optional metal-containing adhesion layer 14 can be formed at a temperature which is from 20° C. to 180° C. In another embodiment, the optional metal-containing adhesion layer 14 can be formed at a temperature which is from 20° C. to 60° C.

The metal-containing adhesion layer 14, which may be optionally employed, can be formed utilizing deposition techniques that are well known to those skilled in the art. For example, the optional metal-containing adhesion layer 14 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer 14 typically has a thickness of from 5 nm to 200 nm, with a thickness of from 50 nm to 150 nm being more typical. Other thicknesses for the optional metal-containing adhesion layer 14 that are below and/or above the aforementioned thickness ranges can also be employed in the present disclosure.

The optional plating seed layer 15 is employed in embodiments in which the stressor layer to be subsequently formed is a metal and plating is used to form the metal-containing stressor layer. The optional plating seed layer 15 is employed to selectively promote subsequent plating of a pre-selected metal-containing stressor layer. The optional plating seed layer 15 may comprise, for example, single layer of Ni or a layered structure of two or more metals such as Al(bottom)/Ti/Ni(top).

The thickness of the optional seed layer 15 may vary depending on the material or materials of the optional plating seed layer 15 as well as the technique used in forming the same. Typically, the optional plating seed layer 15 has a thickness from 2 nm to 400 nm. The optional plating seed layer 15 can be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

Figure 5:
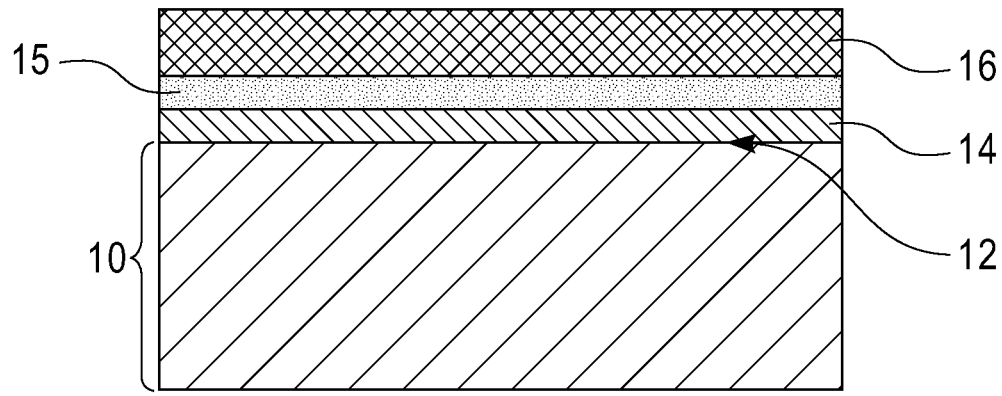
FIG. 5 is a pictorial representation (through a cross sectional view) depicting the structure of FIG. 4 after forming a stressor layer having an intrinsic uniaxial stress atop the base substrate.

Referring now to FIG. 5, there is illustrated the structure of FIG. 4 after forming a stressor layer 16 having an intrinsic uniaxial stress atop the base substrate 10. In one embodiment (not shown), the stressor layer 16 can be formed directly on an upper surface of the optional metal-containing adhesion layer 14. In some embodiments and as illustrated in FIG. 5, the stressor layer 16 can be formed directly on an upper surface of the optional plating seed layer 15. In some embodiments in which the optional metal-containing adhesion layer 14 and the optional plating seed layer 15 are not present, the stressor layer 16 can be formed directly on the uppermost surface 12 of base substrate 10; this particular embodiment is not shown in the drawings, but can readily be deduced from the drawings illustrated in the present application.

The term "intrinsic uniaxial stress" is used throughout the present application to denote that the material has an inherent state of stress in which two of the three principal stress vectors are zero. As such, the stress within the material is in one direction. The stressor layer 16 having uniaxial stress that can be employed in this embodiment of the present disclosure includes any material that is under tensile stress on base substrate 10 at the spalling temperature. As such, the stressor layer 16 can also be referred to herein as a stress-inducing layer.

In accordance with the present disclosure, the stressor layer 16 has a critical thickness and stress value that cause spalling mode fracture to occur within the base substrate 10. By "spalling mode fracture" it is meant that a crack is formed within base substrate 10 and the combination of loading forces maintains a crack trajectory at a depth below the stressor/substrate interface. By critical condition, it is meant that for a given stressor material and base substrate material combination, a thickness value and a stressor value for the stressor layer is chosen that render spalling mode fracture possible (can produce a $K_I$ value greater than the $K_{IC}$ of the substrate). Moreover, mode III stress is substantially reduced since spalling will be performed in the presence of a uniaxial stress load.

The thickness of the stressor layer 16 having intrinsic uniaxial stress is chosen to provide the desired fracture depth within the base substrate 10. For example, if the stressor layer 16 having intrinsic uniaxial stress is chosen to be Ni, then fracture will occur at a depth below the stressor layer 16 roughly 2 to 3 times the Ni thickness. The stress value for the stressor layer 16 having intrinsic uniaxial stress is then chosen to satisfy the critical condition for spalling mode fracture. This can be estimated by inverting the empirical equation given by $t^* = [(2.5 \times 10^6)(K_{IC}^{3/2})]/\sigma^2$, where $t^*$ is the critical stressor layer thickness (in microns), $K_{IC}$ is the fracture toughness (in units of $MPa \cdot m^{1/2}$) of the base substrate 10 and $\sigma$ is the stress value of the stressor layer (in MPa or megapascals). The above expression is a guide, in practice, spalling can occur at stress or thickness values up to 20% less than that predicted by the above expression.

Illustrative examples of materials that are under tensile stress when applied atop the base substrate 10 and thus can be used as the stressor layer 16 having intrinsic uniaxial stress include, but are not limited to, a metal, a polymer, such as a spall inducing tape layer, or any combination thereof. The stressor layer 16 having intrinsic uniaxial stress may comprise a single stressor layer, or a multilayered stressor structure including at least two layers of different stressor material can be employed.

In one embodiment, the stressor layer 16 having intrinsic uniaxial stress is a metal. In another embodiment, the stressor layer 16 having intrinsic uniaxial stress is a spall inducing tape. In another embodiment, for example, the stressor layer 16 having intrinsic uniaxial stress may comprise a two-part stressor layer including a lower part and an upper part. The upper part of the two-part stressor layer can be comprised of a spall inducing tape layer.

When a metal is employed as the stressor layer 16 having intrinsic uniaxial stress, the metal can include, for example, Ni, Cr, Fe, Mo, or W. Alloys of these metals can also be employed. In one embodiment, the stressor layer 16 having intrinsic uniaxial stress includes at least one layer consisting of Ni.

When a polymer is employed as the stressor layer 16 having intrinsic uniaxial stress, the polymer is a large macromolecule composed of repeating structural units. These subunits are typically connected by covalent chemical bonds. Illustrative examples of polymers that can be employed as the stressor layer 16 having intrinsic uniaxial stress include, but are not limited to, polyimides polyesters, polyolefins, polyacrylates, polyurethane, polyvinyl acetate, and polyvinyl chloride.

When a spall inducing tape layer is employed as the stressor layer 16 having intrinsic uniaxial stress, the spall inducing tape layer includes any pressure sensitive tape that is flexible, soft, and stress free at a first temperature used to form the tape, yet strong, ductile and tensile at a second temperature used during removal of the upper portion of the base substrate 10. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate 10 (with a lower thermal coefficient of expansion) and the tape (with a higher thermal expansion coefficient).

Typically, the pressure sensitive tape that is employed in the present disclosure as stressor layer 16 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 16 having intrinsic uniaxial stress employed in the present disclosure can be formed at a first temperature which is at room temperature (15° C.-40° C.). In another embodiment, when a tape layer is employed, the tape layer can be formed at a first temperature which is from 15° C. to 60° C.

In one embodiment, and when the stressor layer 16 is a metal, the metal film having intrinsic uniaxial stress can be formed by sputtering a metal atom from a metal target while rotating the base substrate 10 and/or the target. In another embodiment, it may be possible to manipulate the shape and size of metal film grains, grain boundaries and/or voids (as well as any other structural features affecting film stress) with the use of patterned plating seed layers during metal stressor film growth. Electroplating above the exposed plating seed layer would have a growth direction perpendicular to the upper surface of the base substrate, while lateral overgrowth plating over an insulating line would have a growth direction parallel to the seed surface. In another embodiment, a metal stressor film having intrinsic uniaxial stress can be formed by sputtering a metal that has one grain structure over the lines and another between the lines, or grain boundaries aligned with line edges. The lines and spaces may be formed by conventional lithographic techniques as well as direct write techniques or self-assembly block copolymer technology.

In another embodiment, a metal stressor film having intrinsic uniaxial stress can be formed by sputtering a metal while the substrate 10 is subjected to cylindrical curvature by mechanical means, such as, for example, a mechanical jig or vice. In this embodiment, the initially biaxial stressed stressor layer 16 is converted into uniaxial stress as the substrate 10 is released from the mechanical jig or vice. The radius of curvature of the base substrate 10 during deposition of stressor layer 16 can be from 0.2 meters to 10 meters. The lower radius of curvature corresponds to thinner base substrate 10 thickness values.

When the stressor layer 16 having intrinsic uniaxial stress is a polymer, an initial polymeric stressor layer can be formed by a deposition technique including, for example, dip coating, spin-coating, brush coating, sputtering, chemical vapor deposition, plasma enhanced chemical vapor deposition, chemical solution deposition, and physical vapor deposition. In some instances, the deposited polymeric material may have the desired intrinsic uniaxial stress. In other embodiments, intrinsic uniaxial stress can be provided to the polymeric film by stretching the film prior to application.

When the stressor layer 16 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present disclosure as stressor layer 16 include, for example, Nitto Denko 3193MS thermal release tape, Kapton KPT-1, and Diversified Biotech's CLEAR-170 (acrylic adhesive, vinyl base). In some embodiments, the spalling inducing tape has intrinsic uniaxial stress. In other embodiments, intrinsic uniaxial stress can be provided to the tape by stretching the tape prior to application.

In one embodiment, a two-part stressor layer can be formed on a surface of the base substrate 10, wherein a lower part of the two-part stressor layer is formed at a first temperature which is at room temperature or slight above (e.g., from 15° C. to 60° C.), wherein an upper part of the two-part stressor layer comprises a spall inducing tape layer at an auxiliary temperature which is at room temperature.

If the stressor layer 16 is of a metallic nature, it typically has a thickness of from 3 µm to 50 µm, with a thickness of from 4 µm to 7 µm being more typical. Other thicknesses for the stressor layer 16 that are below and/or above the aforementioned thickness ranges can also be employed in the present disclosure.

If the stressor layer 16 is of a polymeric nature, it typically has a thickness of from 10 µm to 200 µm, with a thickness of from 50 µm to 100 µm being more typical. Other thicknesses for the stressor layer 16 that are below and/or above the aforementioned thickness ranges can also be employed in the present disclosure.

Figure 6:
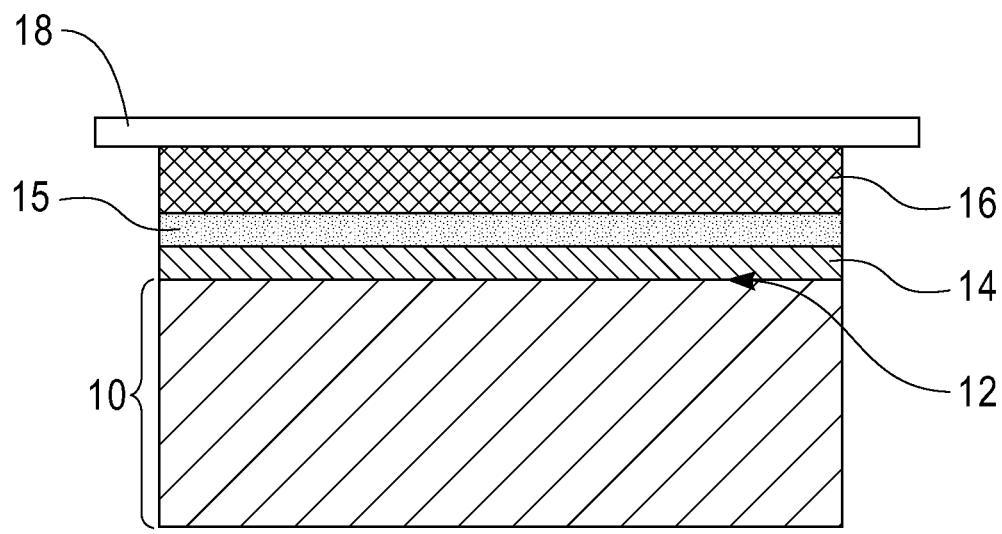
FIG. 6 is a pictorial representation (through a cross sectional view) depicting the structure of FIG. 5 after forming an optional handle substrate atop the stressor layer having an intrinsic uniaxial stress.

Referring to FIG. 6, there is depicted the structure of FIG. 5 after forming an optional handle substrate 18 atop stressor layer 16 having uniaxial stress. The optional handle substrate 18 employed in this embodiment of the present disclosure comprises any flexible material which is either non-stressed or has some stress, e.g., uniaxial stress, which does not affect the nature of the stressor layer 16 having intrinsic uniaxial stress. Illustrative examples of flexible materials that can be employed as the optional handle substrate 18 include a metal foil or a polyimide foil. The optional handle substrate 18 can be used to provide better fracture control and more versatility in handling the spalled material. Moreover, the optional handle substrate 18 can be used to guide the crack propagation during spalling. The optional handle substrate 18 of the present disclosure is typically, but not necessarily, formed at a first temperature which is at room temperature (15° C.-40° C.).

The optional handle substrate 18 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. The optional handle substrate 18 typical has a thickness of from 1 µm to few mm, with a thickness of from 70 µm to 120 µm being more typical. Other thicknesses for the optional handle substrate 18 that are below and/or above the aforementioned thickness ranges can also be employed in the present disclosure.

Figure 7:
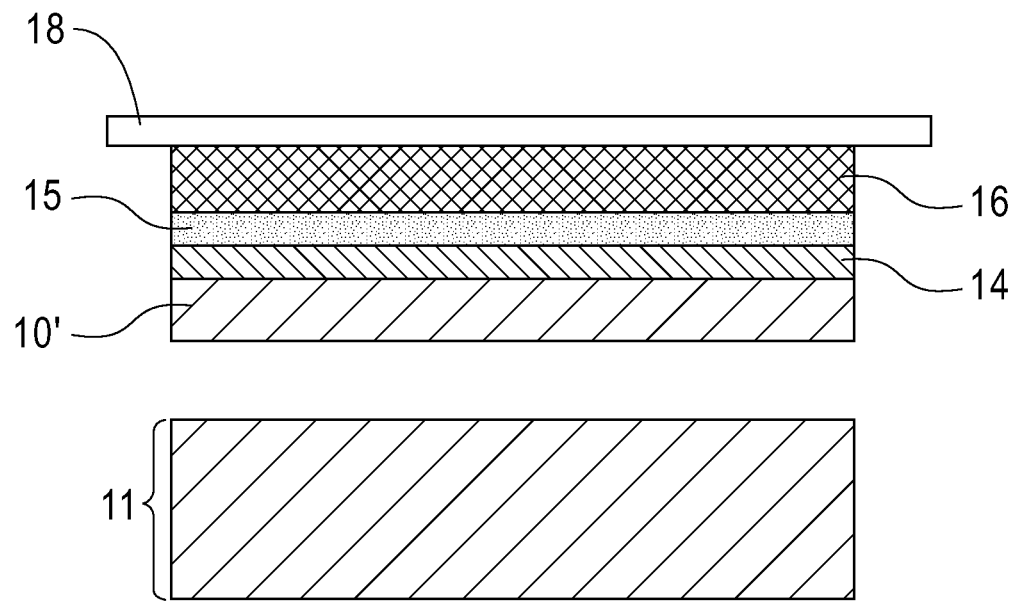
FIG. 7 is a pictorial representation (through a cross sectional view) depicting the structure of FIG. 6 after spalling a material layer from the base substrate.

Referring now to FIG. 7, there is depicted the structure of FIG. 6 after removing a material layer 10' from the base substrate 10 by spalling. In this and other embodiments of the present disclosure, spalling is performed in the present of uniaxial stress, not biaxial stress as is the case in prior art spalling processes. As a result, mode III stress is substantially reduced and the resultant spalled materials have less surface roughness at the edges of the spalled material. Spalling can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure is returned to room temperature by allowing the spalled structure to slowly cool up to room temperature by allowing the same to stand at room temperature. Alternatively, the spalled structure can be heated up to room temperature utilizing any heating means.

After spalling, the optional handle substrate 18, stressor layer 16, and, if present the optional plating seed layer 15 and the optional metal-containing adhesion layer 14 can be removed from the spalled material layer 10'. The remaining portion of base substrate after spalling is labeled as 11. The optional handle substrate 18, the stressor layer 16, the optional plating seed layer 15 and the optional metal-containing adhesion layer portion 14 can be removed from the material layer 10' that was spalled from base substrate 10 utilizing conventional techniques well known to those skilled in the art. For example, and in one embodiment, aqua regia ($HNO_3$/

HCl) can be used for removing the optional handle substrate 18, the stressor layer 16, the optional plating seed layer 15, and the optional metal-containing adhesion layer 14. In another example, UV or heat treatment is used to remove the optional handle substrate 18, followed by a chemical etch to remove the stressor layer16, followed by a different chemical etch to remove the optional plating seed layer 15, and optional metal-containing adhesion layer 14.

The thickness of the material layer 10' that is spalled from the base substrate 10 varies depending on the material of the stressor layer 16 and the material of the base substrate 10 itself. In one embodiment, the material layer 10' that is spalled from the base substrate 10 has a thickness of less than 100 microns. In another embodiment, the material layer 10' that is spalled from the base substrate 10 has a thickness of less than 50 microns.

Figure 8:
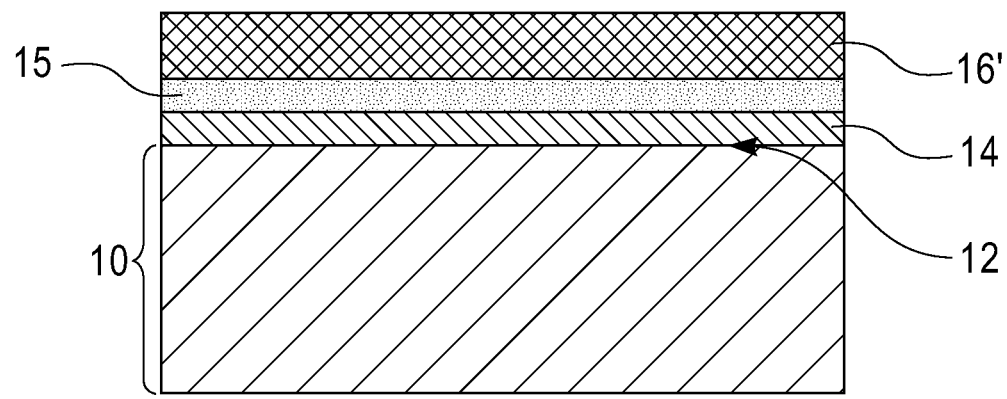
FIG. 8 is a pictorial representation (through a cross sectional view) depicting the structure of FIG. 4 after forming a stressor layer having an intrinsic biaxial stress atop the structure.

Referring now to FIG. 8, there is depicted the structure of FIG. 4 after forming a stressor layer 16' having an intrinsic biaxial stress atop the structure. The stressor layer 16' having the intrinsic biaxial stress can be formed directly atop one of the optional seed layer 15, the optional metal-containing adhesion layer 14, or the base substrate 10.

The stressor layer 16' having the intrinsic biaxial stress can include one of the materials (i.e., metal and/or polymers) mentioned above for the stressor layer 16 having the intrinsic uniaxial stress. The term "intrinsic biaxial stress" denotes that the material has an inherent state of stress including three mutually perpendicular principal stress vectors, wherein two of the stress vectors act in the same plane and one is zero. The stressor layer 16' having the intrinsic biaxial stress can having a thickness within one of the ranges mentioned above for the stressor layer 16 having the intrinsic uniaxial stress. When polymers and tapes are used as the stressor layer 16' having the intrinsic biaxial stress, the polymers and type can be formed as described above for the stressor layer 16 having the intrinsic uniaxial stress. When a metal is employed as the stressor layer 16' having the intrinsic biaxial stress, the metal can be formed by a deposition technique including, for example, dip coating, spin-coating, brush coating, sputtering, chemical vapor deposition, plasma enhanced chemical vapor deposition, chemical solution deposition, and physical vapor deposition.

Figure 9:
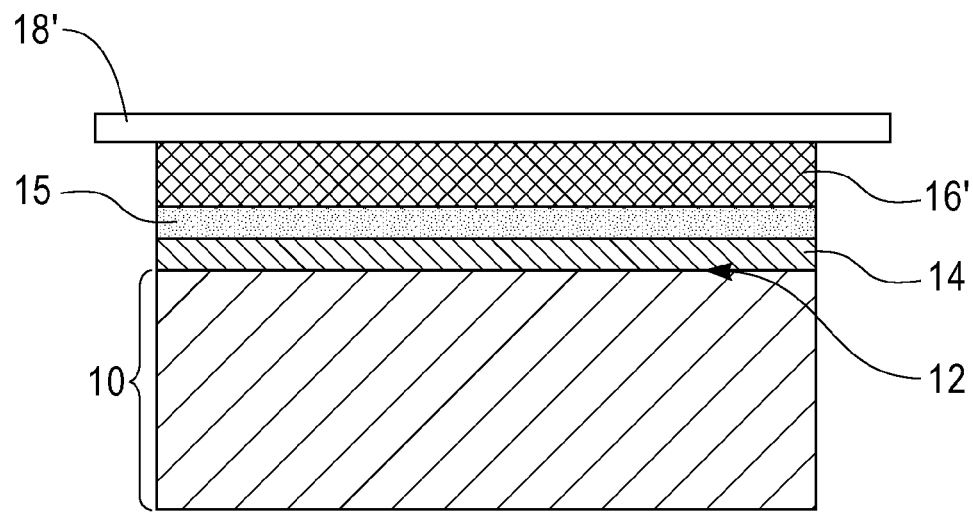
FIG. 9 is a pictorial representation (through a cross sectional view) depicting the structure of FIG. 8 after forming a handle substrate having intrinsic uniaxial stress atop the stressor layer.

Referring now to FIG. 9, there is depicted the structure of FIG. 8 after forming a handle substrate 18' having intrinsic uniaxial stress atop the stressor layer 16'. In this embodiment, the handle substrate 18' includes one of the materials mentioned above for handle substrate 18. The handle substrate 18' can be formed utilizing one of techniques mentioned above for handle substrate 18. It is noted that in this embodiment (as well as any of the other embodiments of the present disclosure), the optional plating seed layer 15 and/or the optional metal-containing adhesion layer 14 can be omitted.

Figure 10:
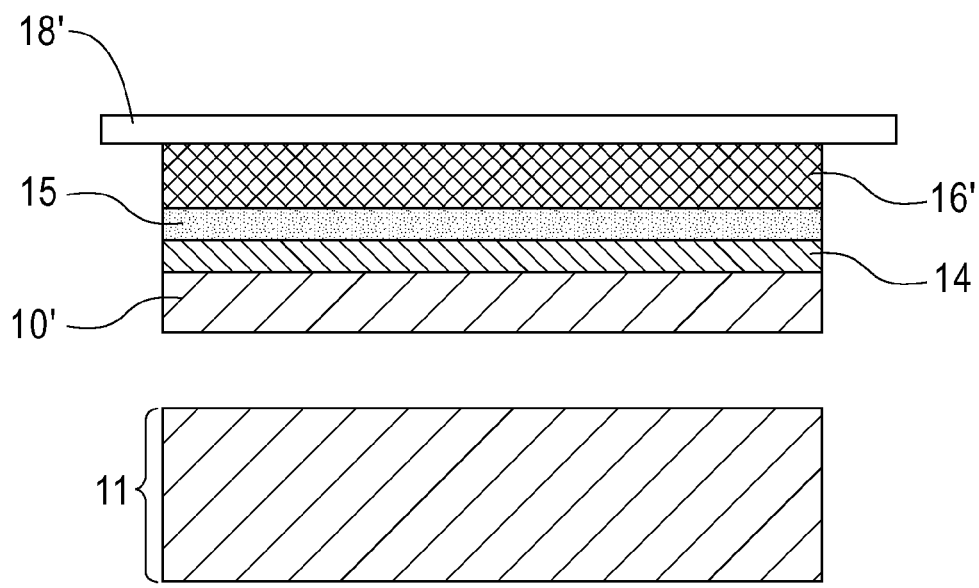
FIG. 10 is a pictorial representation (through a cross sectional view) depicting the structure of FIG. 9 after spalling a material layer from the base substrate.

Referring to FIG. 10, there is depicted the structure of FIG. 9 after spalling a material layer 10' from the base substrate 10. Spalling can be performed as described above. In this embodiment, the net effect of utilizing a stressor layer that has an intrinsic biaxial stress and a handle substrate having intrinsic uniaxial stress is that spalling is essentially carried out with a stressor layer with an uniaxial stress. In this embodiment, the handle substrate 18', the stressor layer 16', the optional plating seed layer 15, and the optional metal-containing adhesion layer 4 can be removed from the spalled material layer 10' as described above.

Figure 11:
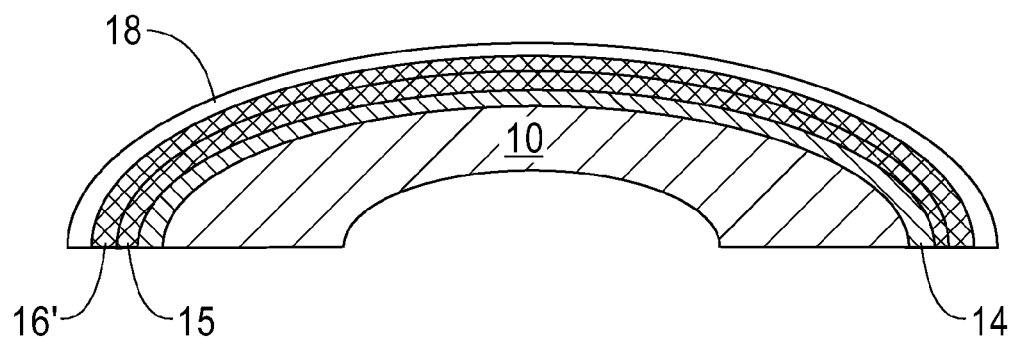
FIG. 11 is a pictorial representation (through a cross sectional view) depicting the structure of FIG. 8 after forming providing an optional handle substrate atop the stressor layer having intrinsic biaxial stress and providing a curvature to the resultant structure.

Referring now to FIG. 11, there is depicted the structure of FIG. 8 after providing an optional handle substrate 18 atop the stressor layer 16' and providing a curvature to the resultant structure. In this embodiment of the present disclosure, the curvature can be provided to structure by hand or by mechanical means, such as, for example, a mechanical jig or vice. The radius of curvature that is provided the structure including at least the base substrate 10 and stressor layer 16' can be from 0.2 to 10 meters (smaller radius of curvature for thin substrates).

Figure 12:
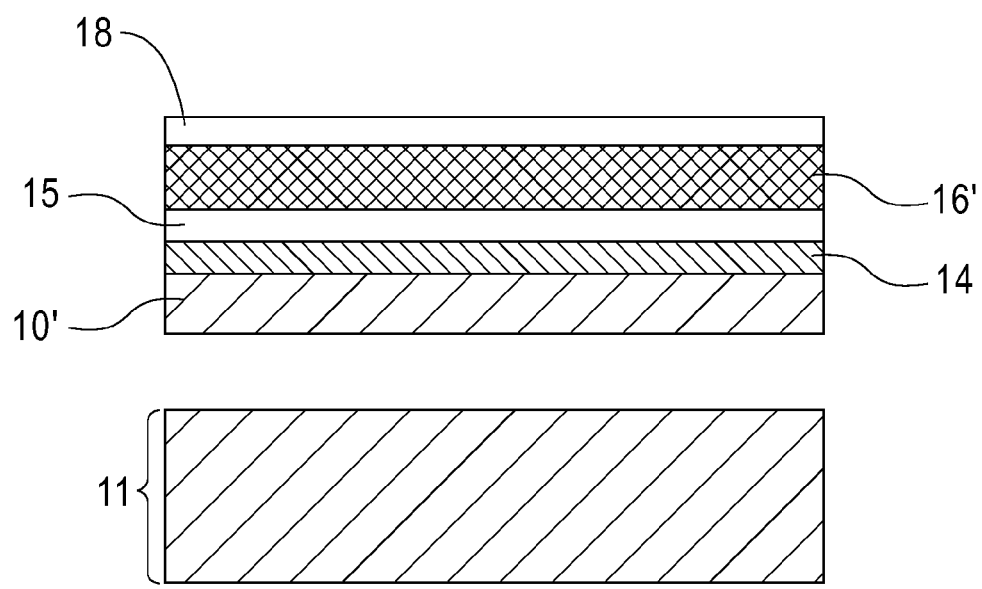
FIG. 12 is a pictorial representation (through a cross sectional view) depicting the structure of FIG. 11 after spalling and releasing the curvature from the structure.

Referring now to FIG. 12, there is illustrated the structure of FIG. 11 after spalling and releasing the curvature from the structure. Spalling is achieved as described above.

It is noted that in the various embodiments depicted in FIGS. 8-12 means are provided which essentially modify (alter) stressor layer 16' to a stressor layer with uniaxial stress. This is achieved by basically cancelling out one of the direction of one of the stress vectors.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of removing a material layer from a base substrate, said method comprising:
   providing a stressor layer with uniaxial stress atop a base substrate, said base substrate has a fracture toughness that is less than that of said stressor layer;
   wherein said providing the stressor layer with uniaxial stress comprises:
   forming an initial stressor layer having intrinsic biaxial stress atop the base substrate; and
   providing a handle substrate having intrinsic uniaxial stress atop the initial stressor layer having said intrinsic biaxial stress; and
   spalling a material layer from said base substrate.

2. The method of claim 1, wherein said initial stressor layer having intrinsic biaxial stress comprises a metal, a polymer or any combination thereof.

3. The method of claim 1, wherein said spalling is performed at room temperature or a temperature of less than room temperature.

4. A method of removing a material layer from a base substrate, said method comprising:
   providing a stressor layer with uniaxial stress atop a base substrate, said base substrate has a fracture toughness that is less than that of said stressor layer;
   wherein said providing the stressor layer with uniaxial stress comprises:
   forming an initial stressor layer having intrinsic biaxial stress atop the base substrate; and
   providing a non-stressed handle substrate atop the base substrate, wherein:
   after said providing the non-stressed handle substrate atop the base substrate the non-stressed handle substrate shrinks in one direction forming a handle substrate with uniaxial stress; and
   spalling a material layer from said base substrate.

5. method of claim 4, wherein said initial stressor layer comprises a metal, a polymer or any combination thereof.

6. The method of claim 4, wherein said spalling is performed at room temperature or a temperature of less than room temperature.

7. A method of removing a material layer from a base substrate, said method comprising:

providing a stressor layer with uniaxial stress atop a base substrate, said base substrate has a fracture toughness that is less than that of said stressor layer;

wherein said providing the stressor layer with uniaxial stress atop a base substrate comprises:

providing a curvature to said base substrate prior to providing said stressor layer;

forming an initial stressor layer that has biaxial stress atop said base substrate having said curvature; and converting the initial stressor layer that has biaxial stress into the stressor layer with uniaxial stress; and spalling a material layer from said base substrate.

8. The method of claim 7, wherein said initial stressor layer comprises a metal, a polymer or any combination thereof.

9. The method of claim 7, wherein said spalling is performed at room temperature or a temperature of less than room temperature.

* * * * *